(12) United States Patent
Chopra

(10) Patent No.: US 8,954,803 B2
(45) Date of Patent: Feb. 10, 2015

(54) PROGRAMMABLE TEST ENGINE (PCDTE) FOR EMERGING MEMORY TECHNOLOGIES

(75) Inventor: Rajesh Chopra, Pleasanton, CA (US)

(73) Assignee: MoSys, Inc., Santa Clara, CA (US)

( * ) Notice: Subject to any disclaimer, the term of this patent is extended or adjusted under 35 U.S.C. 154(b) by 725 days.

(21) Appl. No.: 13/030,358

(22) Filed: Feb. 18, 2011

(65) Prior Publication Data
US 2011/0209002 A1 Aug. 25, 2011

Related U.S. Application Data

(60) Provisional application No. 61/338,745, filed on Feb. 23, 2010.

(51) Int. Cl.
*G06F 11/00* (2006.01)
*G06F 11/263* (2006.01)
*G06F 11/27* (2006.01)
*G11C 29/56* (2006.01)

(52) U.S. Cl.
CPC .............. *G06F 11/263* (2013.01); *G06F 11/27* (2013.01); *G11C 29/56* (2013.01); *G11C 29/56004* (2013.01)
USPC ................................. 714/30; 714/31; 714/748

(58) Field of Classification Search
USPC ...................... 714/30, 31, 718, 748
See application file for complete search history.

(56) References Cited

U.S. PATENT DOCUMENTS

| | | | | |
|---|---|---|---|---|
| 3,962,687 A * | 6/1976 | Suzumura et al. | ............ | 365/200 |
| 5,095,179 A * | 3/1992 | Ho | ................................ | 178/2 B |
| 5,491,463 A * | 2/1996 | Sargeant et al. | ........... | 340/12.37 |
| 5,835,850 A * | 11/1998 | Kumar | ........................ | 455/67.14 |
| 6,125,421 A * | 9/2000 | Roy | ................................. | 711/5 |
| 6,920,544 B2 * | 7/2005 | Watanabe | ...................... | 711/217 |
| 7,168,005 B2 * | 1/2007 | Adams et al. | ................... | 714/31 |
| 7,360,134 B1 | 4/2008 | Jacobson et al. | | |
| 7,936,682 B2 * | 5/2011 | Singh et al. | .................... | 370/241 |
| 8,234,540 B2 * | 7/2012 | Buchmann et al. | ........... | 714/758 |
| 8,245,105 B2 * | 8/2012 | Dell et al. | ...................... | 714/758 |
| 8,281,049 B2 * | 10/2012 | Grishaw | ........................... | 710/29 |
| 8,301,885 B2 * | 10/2012 | Kopetz et al. | ................. | 713/168 |

(Continued)

OTHER PUBLICATIONS

Search Report from related Singapore Application No. 201101222-6 dated Dec. 2, 2011, 6 pages.

*Primary Examiner* — Loan L. T. Truong
(74) *Attorney, Agent, or Firm* — Bever, Hoffman & Harms, LLP

(57) ABSTRACT

A programmable characterization-debug-test engine (PCDTE) on an integrated circuit chip. The PCDTE includes an instruction memory that receives and stores instructions provided on a chip interface, and a configuration memory that receives and stores configuration values provided on the chip interface. The PCDTE also includes a controller that configures a plurality of address counters and data registers in response to the configuration values. The controller also executes the instructions, wherein read/write addresses and write data are retrieved from the counters in response to the instructions. The retrieved read/write addresses and write data are used to access a memory under test. Multiple ports of the memory under test may be simultaneously accessed. Multiple instructions may be linked. The instructions may specify special counting functions within the counters and/or specify integrated (linked) counters. The PCDTE may transmit information off of the chip to exercise transmit/receive circuitry of the chip.

32 Claims, 10 Drawing Sheets

(56) References Cited

U.S. PATENT DOCUMENTS

| | | | |
|---|---|---|---|
| 8,665,938 B2* | 3/2014 | Yu et al. | 375/228 |
| 8,832,831 B2* | 9/2014 | Chesla et al. | 726/22 |
| 2002/0002573 A1* | 1/2002 | Landers et al. | 708/501 |
| 2002/0091899 A1* | 7/2002 | Weedon | 711/118 |
| 2005/0076228 A1* | 4/2005 | Davis et al. | 713/188 |
| 2006/0156088 A1* | 7/2006 | Andreev et al. | 714/718 |
| 2006/0179369 A1* | 8/2006 | Bravo et al. | 714/718 |
| 2008/0005706 A1* | 1/2008 | Sharma et al. | 716/4 |
| 2008/0059850 A1 | 3/2008 | Bahl | |
| 2008/0148007 A1* | 6/2008 | Lee | 711/202 |
| 2008/0178053 A1* | 7/2008 | Gorman et al. | 714/718 |
| 2009/0007134 A1* | 1/2009 | Chiu et al. | 718/106 |
| 2009/0144595 A1 | 6/2009 | Reohr, Jr. et al. | |
| 2009/0219775 A1* | 9/2009 | Hur et al. | 365/201 |
| 2010/0241830 A1* | 9/2010 | Owens et al. | 712/42 |
| 2011/0078421 A1* | 3/2011 | Greiner et al. | 712/227 |
| 2011/0161229 A1* | 6/2011 | Mastrangelo et al. | 705/44 |
| 2011/0191647 A1 | 8/2011 | Miller et al. | |

* cited by examiner

PROGRAMMABLE TEST ENGINE (PCDTE) FOR EMERGING MEMORY TECHNOLOGIES

RELATED APPLICATIONS

This application claims priority from U.S. Provisional Patent Application 61/338,745, entitled "Programmable Test Engine For Emerging Memory Technologies", which was filed on Feb. 23, 2010, and is incorporated by reference herein.

FIELD OF THE INVENTION

The present invention relates to a programmable characterization debug test engine (PCDTE).

RELATED ART

Conventional built in self test (BIST) engines, such as that described in U.S. Pat. No. 7,168,005, only implement fixed test patterns. It would be desirable to have a BIST having test patterns and counters that are programmable. It would further be desirable for such a Programmable BIST to have approximately the same gate count as a conventional BIST.

SUMMARY

Accordingly, the present invention provides a programmable characterization-debug-test engine (PCDTE) on an integrated circuit chip. The PCDTE includes an instruction memory that stores instructions received from a chip interface, and a configuration memory that stores configuration values received on the chip interface. The PCDTE also includes a controller that configures a plurality of counters and fills a plurality of data registers in response to the configuration values stored in the configuration memory. Operating parameters of the counters that are configured in response to the configuration values include: whether the counters are incremented or decremented, the number of steps implemented by the counters, the step size of the counters and the reset values of the counters. Selected counters can be configured to implement a special counter function, wherein the reset value of the counter is incremented each time that a counter expires. Other counters can be linked to implement an integrated counter, wherein a first counter is configured to a row address of a memory access address, a second counter is configured to provide a column address of the memory access address, a third counter is configured to provide a sector address of the memory access address, and a fourth counter is configured to provide a bank address of the memory access address.

The controller also executes the instructions stored in the instruction memory. Each instruction includes an access generation op-code and a loop manipulation op-code. The access generation op-code specifies a read access and/or a write access, or no operation (NOP) to the memory under test. Read and write accesses to a memory under test can be implemented simultaneously by the PCDTE. The access generation op-code includes a read address pointer that specifies which of the counters is selected to provide a read address, a write address pointer that specifies which of the counters is selected to provide a write address, and a write data pointer that specifies which of the data registers is selected to provide a write data value (or a read compare value).

The loop manipulation op-code includes a loop counter pointer that specifies which of the counters is selected to operate as a loop counter for the associated instruction. The loop counter specifies the number of times the read/write accesses specified by the access generation op-code will be repeated. The loop manipulation op-code includes parameters that allow the associated instruction to be linked to another instruction. The loop manipulation op-code also includes parameters that allow multiple counters (e.g., the loop counter, a read address counter and a write address counter) to be updated in parallel. The loop manipulation op-code also includes parameters that allow sets of the counters to be updated sequentially.

The PCDTE of the present invention provides flexibility in generating test patterns within the integrated circuit. The PCDTE is easily scaled, thereby allowing memories having a large number of ports to be tested.

In a particular embodiment, the PCDTE of the present invention is also coupled to a transmitter of the integrated circuit chip, wherein the memory access signals generated by the PCDTE are serialized and transmitted off of the integrated circuit chip. These memory access signals can be routed to a de-serializing receiver of the same integrated circuit chip (in a loop-back configuration), and ultimately be provided to the memory under test (on the integrated circuit chip). In this embodiment, the PCDTE advantageously exercises the transmit and receive circuitry of the integrated circuit chip. In an alternate embodiment, the memory access signals can be routed to a de-serializing receiver of another integrated circuit chip, and be provided to a memory on this other chip.

The present invention will be more fully understood in view of the following description and drawings.

DETAILED DESCRIPTION

In general, the present invention provides a programmable characterization-debug-test engine (PCDTE) engine, which is located on an integrated circuit chip. The PCDTE can be used to implement characterization, debug and test functions for circuitry (e.g., one or more memories) located on the chip. In addition, the PCDTE can create transactions that are transmitted off of the chip, and are either returned to a receiver of the same chip, or provided to a receiver of a different chip.

The PCDTE of the present invention can be used for characterizing the timing, voltages and patterns that can be exercised to achieve the optimal operating conditions of the memory. The PCDTE of the present invention can also be used as a debug engine, for debugging various on-chip circuits that interface to the memory bit-cells. The PCDTE of the present invention can also be used as an on-chip built-in self tester (BIST), to test the memories with the programmable patterns that are discovered during the characterization and debug phase. The PCDTE of the present invention can also be used for burn-in and hot temperature operating life (HTOL) studies.

The PCDTE of the present invention works well in evaluating emerging dense single and multi-port memories and high-speed circuits while maintaining a low gate count for a particular memory instance or memory instances. One or more of the memory instances may or may not be the same in terms of size, data width or flavor (Mosys 1T-SRAM, eDRAM, SRAM etc).

Figure 1:
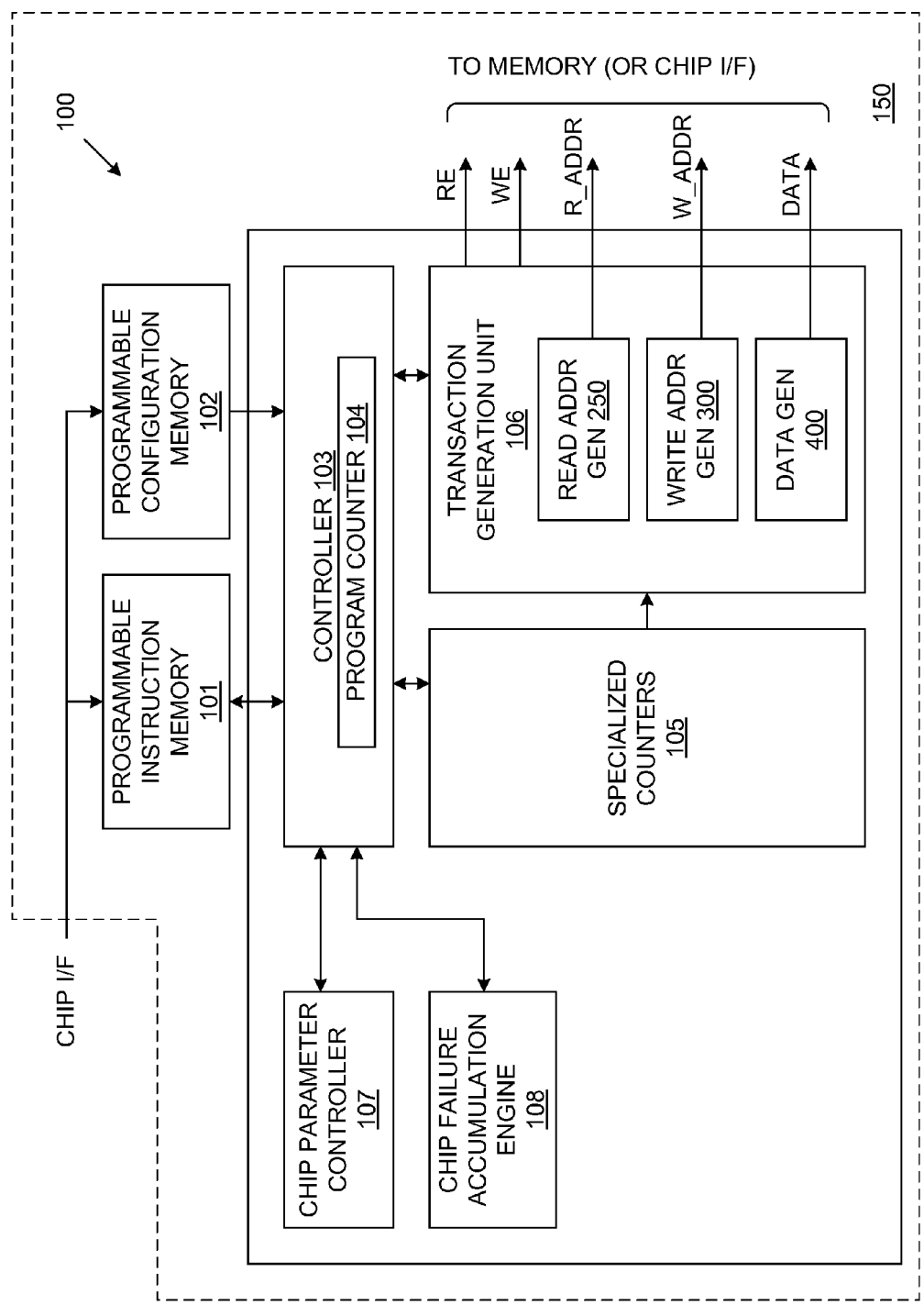
FIG. 1 is a block diagram of a programmable characterization-debug-test engine (PCDTE), which is fabricated on an integrated circuit chip, in accordance with one embodiment of the present invention.

FIG. 1 is a block diagram of a PCDTE 100, which is fabricated on an integrated circuit chip 150, in accordance with one embodiment of the present invention. PCDTE 100 includes programmable instruction memory 101, programmable configuration memory 102, a controller 103 (which controls the program counter 104 of the PCDTE), several specialized counters 105, transaction generation unit 106, chip parameter controller 107 and chip failure accumulation engine 108. Transaction generation unit 106 includes read address generation circuit 250, write address generation circuit 300 and data generation circuit 400.

Programmable instruction memory 101 stores instruction op-codes, which are described in more detail below. Programmable instruction memory 101 is implemented, for example, using a random access memory (RAM) or a flip-flop array. Programmable instruction memory 101 can be programmed through the serial or parallel interface of chip 150, in accordance with one embodiment of the present invention. Programmable instruction memory 101 can store M instructions, wherein M is dictated by the gate count requirements, type of memory technology, chip interface and overall characterization, debug and test strategy of chip 150.

Programmable configuration memory 102 stores configuration parameters of PCDTE 100. In general, the configuration parameters stored by programmable configuration memory 102 are used to configure specialized counters 105, read address generation circuit 250, write address generation circuit 300 and data generation circuit 400. The configuration parameters stored by programmable configuration memory 102 are described in more detail below. Programmable configuration memory 102 can be implemented, for example, using a flip-flop array. In accordance with one embodiment of the present invention, programmable configuration memory 102 can also be programmed through the serial or parallel interface of chip 150.

Controller 103 is coupled to programmable instruction memory 101 and programmable configuration memory 102. As described in more detail below, controller 103 configures specialized counters 105 and transaction generation unit 106 in response to configuration parameters received from programmable configuration memory 102. In addition, controller 103 uses specialized counters 105 and transaction generation unit 106 to initiate read and write transactions to a memory being characterized-debugged-tested in response to instructions retrieved from programmable instruction memory 101. In the illustrated embodiments, PCDTE 100 includes one read port (which carries the read enable signal RE and the read address R_ADDR) and one write port (which carries the write enable signal WE, the write address W_ADDR and the write data DATA) for accessing the memory being tested. Although only two ports are illustrated in the described embodiment, as described in more detail below, transaction generation unit 106 is easily modified to implement other numbers of ports in other embodiments.

In general, chip parameter controller 107 is used to change the operating conditions of chip 150 (e.g., voltages and timing) in response to instructions stored in programmable instruction memory 101. Memory failure accumulation engine 108 can store Data 0, Data 1 failures or failing (Data 0 and 1 combined) data, which can be used to bit-map the memory under test.

Figure 2A:
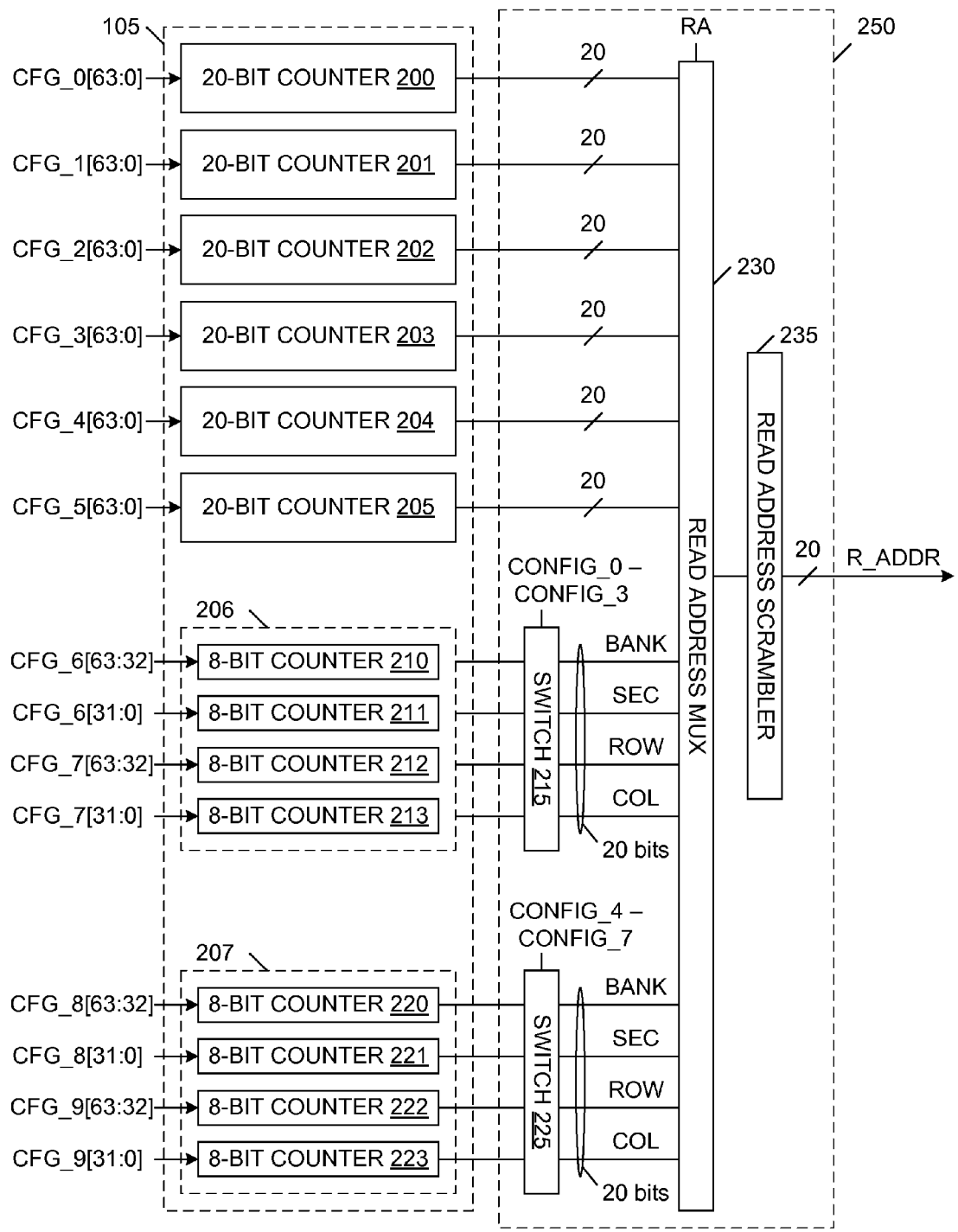
FIG. 2A is a block diagram illustrating specialized counters and read address generation circuitry implemented by the PCDTE of FIG. 1, in accordance with one embodiment of the present invention.

FIG. 2A is a block diagram that illustrates specialized counters 105 in accordance with one embodiment of the present invention. These specialized counters include six 20-bit counters 200-205 (i.e., large counters,), a first set of small counters 206, which includes four 8-bit (small) counters 210-213, and second set of small counters 207, which includes four 8-bit (small) counters 220-223. Although the present invention is described in connection with a particular group of counters, it is understood that the group of specialized counters 105 can be easily modified to include other numbers of counters, and counters having other widths.

FIG. 2A also illustrates the read address generation circuit 250 of transaction generation unit 106, which is used to generate the read address R_ADDR. Read address generation circuit 250 includes read address switch 215, which is coupled to receive counter values from 8-bit small counters 210-213, read address switch 225, which is coupled to receive counter values from 8-bit small counters 220-223, read address multiplexer 230, which is coupled to receive counter values from 20-bit large counters 200-205 and read address switches 215 and 225, and read address scrambler 235, which is coupled to receive a counter value from read address multiplexer 230.

Figure 2B:
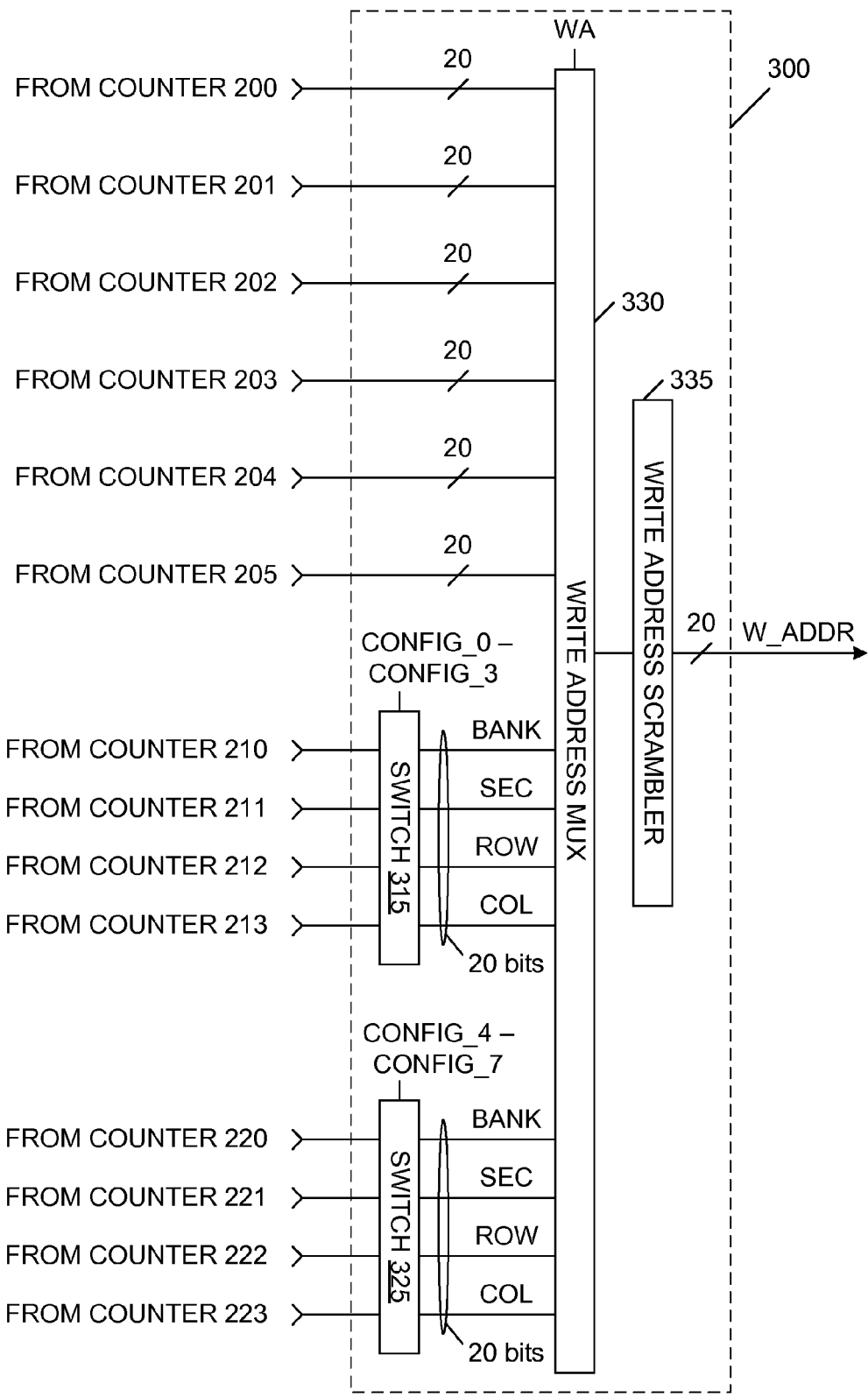
FIG. 2B is a block diagram illustrating write address generation circuitry implemented by the PCDTE of FIG. 1, in accordance with one embodiment of the present invention.

FIG. 2B is a block diagram that illustrates the write address generation circuit 300 of transaction generation unit 106, which is used to generate the write address W_ADDR. Write address generation circuit 300 includes write address switch 315, which is coupled to receive counter values from 8-bit small counters 210-213, write address switch 325, which is coupled to receive counter values from 8-bit small counters 220-223, write address multiplexer 330, which is coupled to receive counter values from 20-bit large counters 200-205 and write address switches 315 and 325, and write address scrambler 335, which is coupled to receive a counter value from write address multiplexer 330. Note that write address generation circuit 300 is coupled to receive the counter values provided by counters 200-205, 210-213 and 220-223, in parallel with read address generation circuit 250.

There are several types of counters which can co-exist within specialized counters 105. These counter types can include, for example, normal counters, integrated counters (which use several small counters to implement a larger counter), and special function counters. Special function counters implemented by the present invention include linear feedback shift register (LFSR) counters (which use LFSR Boolean functions to provide a random count), and counters that generate count values to implement moving inversion tests. Although particular special function counters are described herein, it is understood that other types of special function counters can be implemented in other embodiments. In the illustrated example, 20-bit counters 200-205 can be configured to implement normal counters, random counters or special function counters. The sets of small counters 206 and 207 can be configured to implement normal counters, random counters or integrated counters. When small counter set 206 is configured to implement an integrated counter, the four 8-bit counters 210, 211, 212 and 213 are used to store column, row, sector and bank addresses. Similarly, when small counter set 207 is configured to implement an integrated counter, the four 8-bit counters 220, 221, 222 and 223 are used to store column, row, sector and bank addresses.

The counters 200-207 are programmed (configured) in response to configuration values stored in configuration registers within programmable configuration memory 102.

Figure 3A:
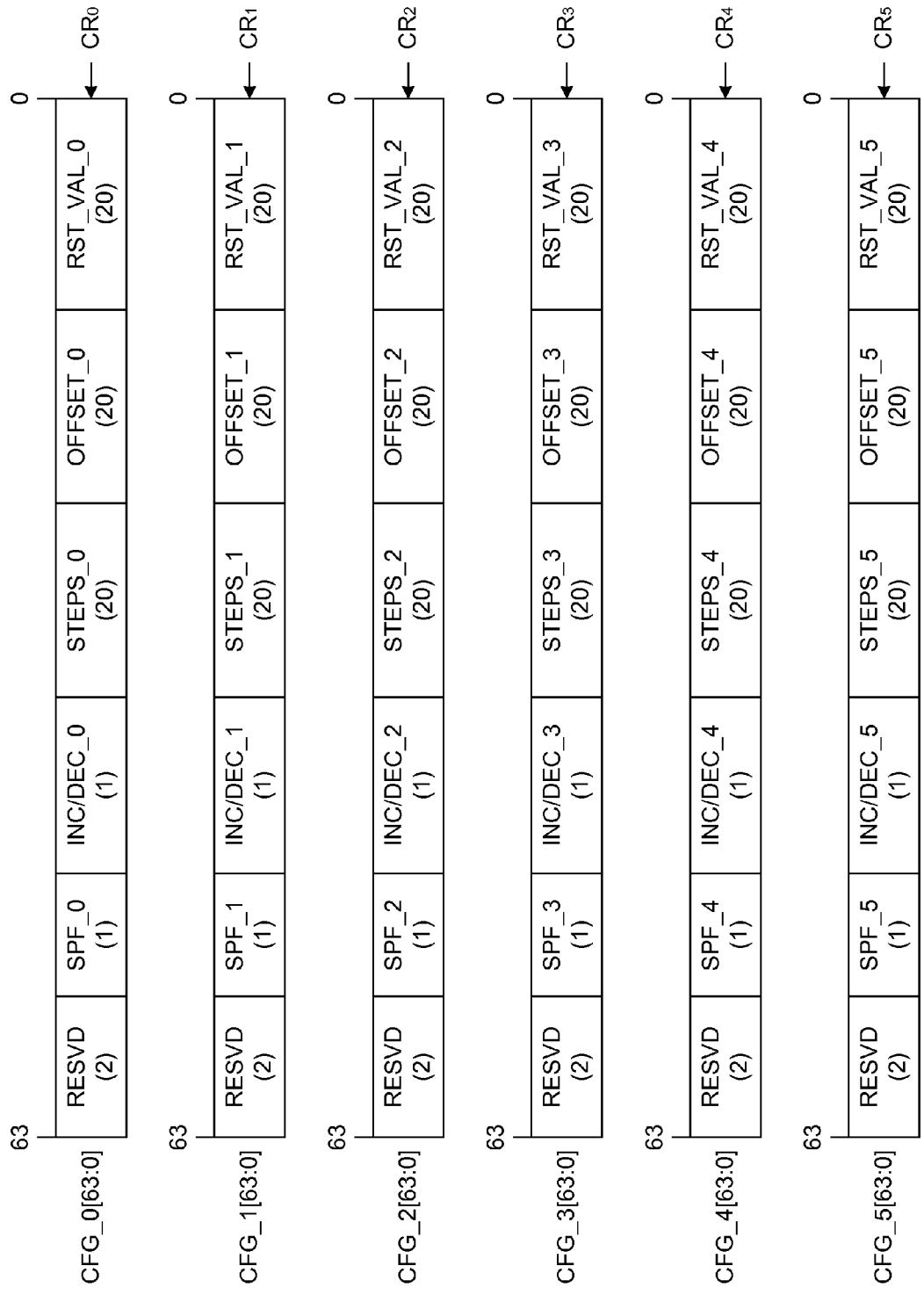
FIGS. 3A, 3B and 3C are block diagrams illustrating configuration registers used to configure the specialized counters of FIG. 2A, in accordance with one embodiment of the present invention.
Figure 3B:
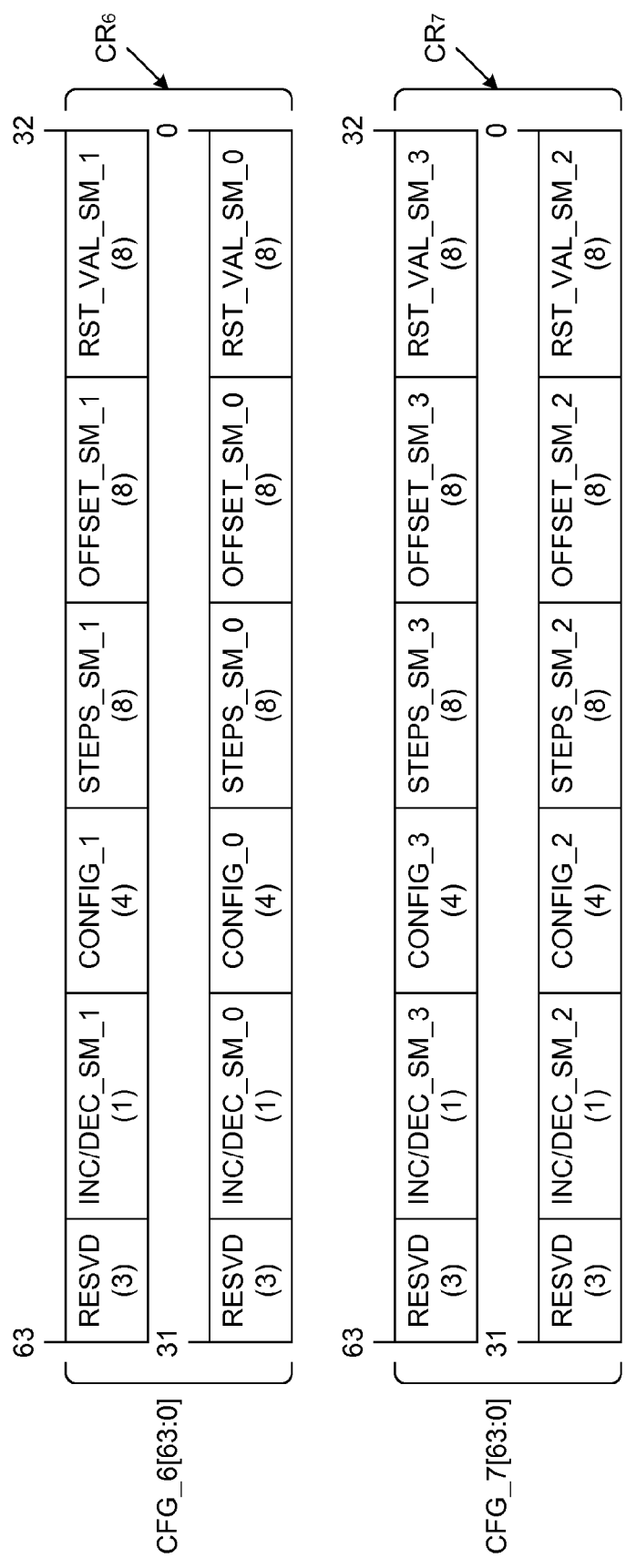
Figure 3C:
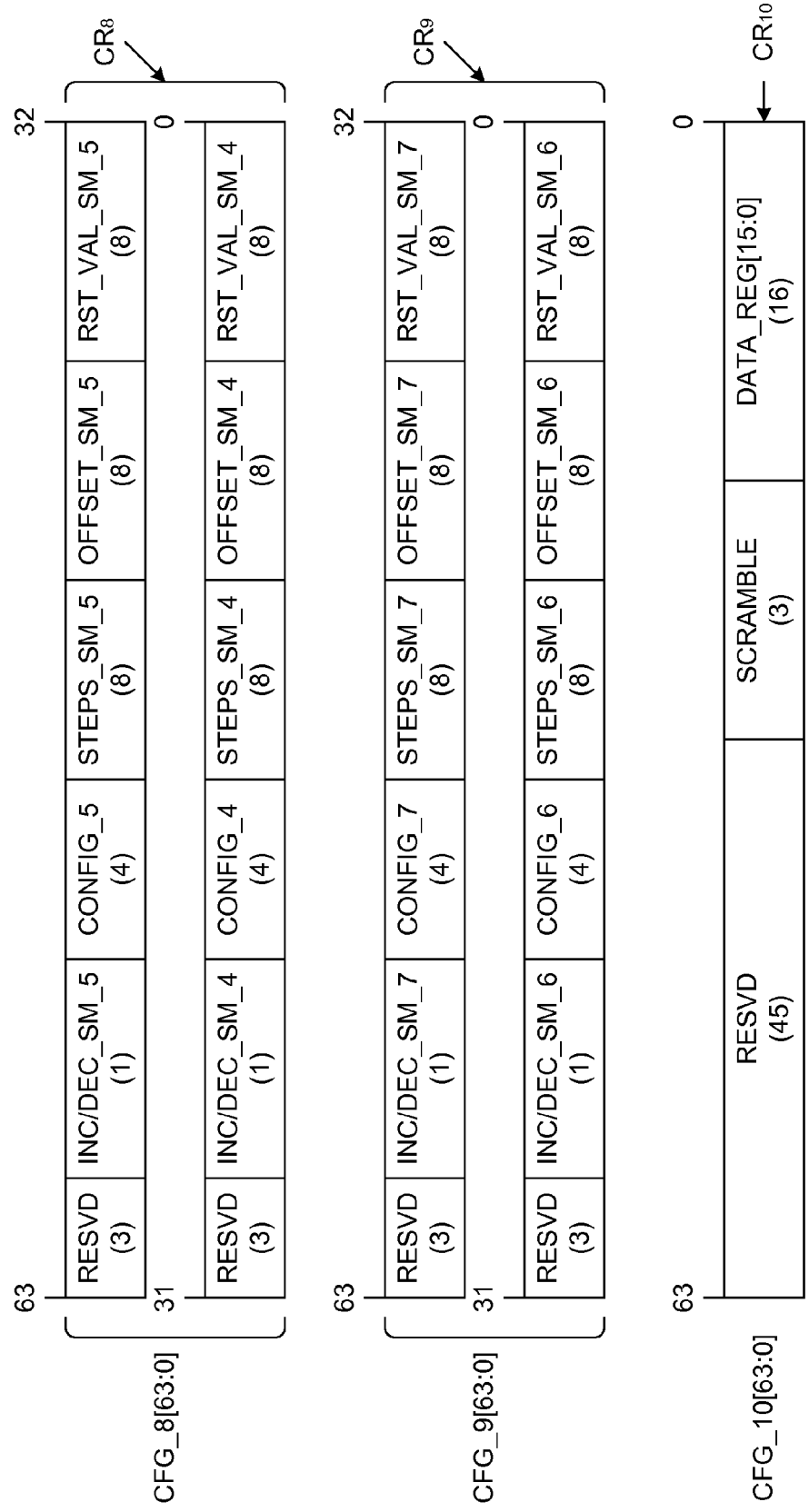

FIGS. 3A, 3B and 3C are block diagrams illustrating configuration registers $CR_0$-$CR_{10}$ of programmable configuration memory 102 in accordance with one embodiment of the present invention. In the illustrated embodiment, programmable configuration memory 102 includes eleven configuration registers $CR_0$-$CR_{10}$, each of which is 64-bits wide.

FIG. 3A illustrates configuration registers $CR_0$-$CR_5$. These configuration registers $CR_0$-$CR_5$ store configuration values CFG_0[63:0] to CFG_5[63:0], which configure large counters 200 to 205, respectively.

FIG. 3B illustrates configuration register $CR_6$ and $CR_7$. Configuration register $CR_6$ stores configuration value CFG_6 [63:0], which configures small counters 210 and 211. Configuration register $CR_7$ stores configuration value CFG_7[63:0], which configures small counters 212 and 213.

FIG. 3C illustrates configuration registers $CR_8$-$CR_{10}$. Configuration register $CR_8$ stores configuration value CFG_8[63:0], which configures small counters 220 and 221. Configuration register $CR_9$ stores configuration value CFG_9[63:0], which configures counters 222 and 223. As described in more detail below, configuration register $CR_{10}$ stores a configuration value CFG_10[63:0] that is used to configure data generation circuit 400 within transaction generation unit 106.

As illustrated by FIG. 3A, each of the six configuration registers values CFG_0 to CFG_5 includes two reserved bits RESVD, a special function bit SPF_N, an increment-decrement bit INC/DEC_N, a 20-bit 'number of steps' value STEPS_N, a 20-bit offset value OFFSET_N, and a 20-bit reset value RST_VAL_N, (wherein N=0 for configuration register value CFG_0, N=1 for configuration register value CFG_1, etc.).

The increment-decrement value INC/DEC_N indicates whether the associated counter is incremented or decremented (e.g., INC/DEC_N='0' causes the associated counter to be decremented, while INC/DEC_N='1' causes the associated counter to be incremented). The 'number of steps' value STEPS_N specifies the number of steps that the associated counter will count. The offset value OFFSET_N indicates the size of each counter step (e.g., OFFSET_N=2 causes the associated counter to be incremented-decremented in steps of two). The 20-bit reset value RST_VAL_N specifies the value to which the corresponding counter will be reset upon expiration (i.e., upon counting the number of steps specified by STEPS_N).

The special function bit SPF_N indicates whether the associated counter implements a special counter function (e.g., SPF_N='0' disables the special function in the associated counter, while SPF_N='1' enables the associated counter to implement the special counter function). In the embodiments described herein, large counters 200-203 are configured to implement a first special function, and large counters 204-205 are configured to implement a second special function, different than the first special function. More specifically, when the special counter function is enabled within any one of the large counters 200-203, then the reset value of this counter is incremented by '1' upon expiration of this counter. For example, if the special counter function is enabled for large counter 203 (i.e., SPF_3=1), then each time that this large counter 203 expires, the reset value RST_VAL_3 of this counter is incremented by '1'. As known to those skilled in the art, this special function enables the creating of a moving inversion test pattern.

When the special counter function is enabled within any one of the large counters 204-205, then this large counter is enabled to implement a LFSR counter, such that this large counter provides a random count output. For example, if the special counter function is enabled for large counter 204 (i.e., SPF_4=1), then this large counter 204 is configured to operate as an LFSR counter. In the foregoing manner, large counters 200-205 can advantageously be configured in a flexible manner to provide a wide range of counter options.

As illustrated by FIG. 3B, the configuration register $CR_6$ stores a corresponding 64-bit configuration value CFG_6[63:0], which includes a first 32-bit configuration value CFG_6 [31:0] and a second 32-bit configuration value CFG_6[63:32]. The first 32-bit configuration value CFG_6[31:0] is used to configure 8-bit small counter 210, and the second 32-bit configuration value CFG_6[63:32] is used to configure 8-bit small counter 211. The first 32-bit configuration value CFG_6[31:0] includes three reserved bits RESVD, an increment-decrement bit INC/DEC_SM_0, a 4-bit configuration value CONFIG_0, an 8-bit 'number of steps' value STEPS_SM_0, an 8-bit offset value OFFSET_SM_0, and an 8-bit reset value RST_VAL_SM_0.

The increment-decrement value INC/DEC_SM_0 indicates whether the associated small counter 210 is incremented or decremented (e.g., INC/DEC_SM_0='0' causes counter 210 to be decremented, while INC/DEC_SM_0='1' causes counter 210 to be incremented). The 8-bit 'number of steps' value STEPS_SM_0 specifies the number of steps that the associated small counter 210 will count. The 8-bit offset value OFFSET_SM_0 indicates the size of each step of counter 210 (e.g., OFFSET_N=1 causes small counter 210 to be incremented-decremented in steps of one). The 8-bit reset value RST_VAL_SM_0 specifies the value to which small counter 210 will be reset upon expiration (i.e., upon counting the number of steps specified by STEPS_SM_0). The configuration value CONFIG_0 indicates whether the associated counter 210 is configured to provide a bank address (CONFIG_0='1000'), a sector address (CONFIG_0='0100'), a row address (CONFIG_0='0010'), a column address (CONFIG_0='0001'), or none of these address types (CONFIG_0='0000').

The second 32-bit configuration value CFG_6[63:32] includes similar bits/values: RESVD, INC/DEC_SM_1, CONFIG_1, STEPS_SM_1, OFFSET_SM_1 and RST_VAL_SM_1, which configure the 8-bit small counter 211 in the manner described above.

As also illustrated by FIG. 3B, the configuration register $CR_7$ stores a corresponding 64-bit configuration value CFG_7[63:0], which includes a first 32-bit configuration value CFG_7[31:0] and a second 32-bit configuration value CFG_7[63:32]. The first 32-bit configuration value CFG_7 [31:0] includes bits/values RESVD, INC/DEC_SM_2, CONFIG_2, STEPS_SM_2, OFFSET_SM_2 and RST_VAL_SM_2, which configure the 8-bit small counter 212 in the manner described above. Similarly, the second 32-bit configuration value CFG_7[63:32] includes bits/values RESVD, INC/DEC_SM_3, CONFIG_3, STEPS_SM_3, OFFSET_SM_3 and RST_VAL_SM_3, which configure the 8-bit small counter 213 in the manner described above.

As illustrated by FIG. 3C, the configuration registers $CR_8$ and $CR_9$ store 64-bit configuration values CFG_8[63:0] and CFG_9[63:0], respectively. The configuration value CFG_8 [63:0] includes a 32-bit configuration value CFG_8[31:0] used to configure small counter 220 in the manner described above, and a 32-bit configuration value CFG_8[63:32] used to configure small counter 221 in the manner described above. The configuration value CFG_9[63:0] includes a 32-bit configuration value CFG_9[31:0] used to configure small counter 222 in the manner described above, and a 32-bit configuration value CFG_9[63:32] used to configure small counter 223 in the manner described above.

In the above-described manner, the configuration values CFG_0 to CFG_9 enable the 20-bit large counters 200-205, the 8-bit small counters 210-213 of counter set 206 and the 8-bit small counters 220-223 of counter set 207 to be independently configured to implement a wide variety of counters, thereby providing flexibility to the read/write address generation capabilities of PCDTE 100.

As illustrated in FIGS. 2A and 2B, the configuration values CONFIG_0 to CONFIG_3 stored in configuration registers $CR_6$ and $CR_7$ are used to configure read switch 215 (FIG. 2A) and write switch 315 (FIG. 2B). Read switch 215 routes the output of counters 210, 211, 212 and 213 to the address buses (i.e., bank, sector, row or column) specified by the configuration values CONFIG_0, CONFIG_1, CONFIG_2 and CONFIG_3, respectively. For example, if the configuration values CONFIG_0, CONFIG_1, CONFIG_2 and CONFIG_3 have values of '0010', '1000', '0100' and '0001', respectively, then read switch 215 will route the counter values from counters 210, 211, 212 and 213 as row, bank, sector and column addresses, respectively. Write switch 315 operates in the same manner as read switch 215 in response to the configuration values CONFIG_0 to CONFIG_3.

The configuration values CONFIG_4 to CONFIG_7 stored in configuration registers $CR_8$ and $CR_9$ are used to configure the read switch 225 (FIG. 2A) and the write switch 325 (FIG. 2B) to route the outputs of counters 220-223 in the manner described above. As a result, the contents of counters 210-213 and 220-223 can be flexibly routed to provide bank, section, row and column addresses for accessing the memory under test. Note that four 8-bit counters are used to provide 20-bit access addresses at the outputs of switches 215, 225, 315 and 325 in the illustrated embodiments. This is accomplished by properly selecting the 'number of steps' values STEPS_SM_0-7 and offset values OFFSET_SM_0-7.

Read address multiplexer 230 (FIG. 2A) receives the 20-bit counter values from large counters 200-205 and small counter sets 206-207. Read address multiplexer 230 routes one of these 20-bit counter values in response to a read address selection signal RA (which is described in more detail below). Read address scrambler 235 scrambles the received counter value, using a predetermined fixed address scrambling function, thereby providing the read address value R_ADDR to the memory under test.

Similarly, write address multiplexer 330 (FIG. 2B) receives the 20-bit counter values from large counters 200-205 and small counter sets 206-207. Write address multiplexer 330 routes one of these 20-bit counter values in response to a write address selection signal WA (which is described in more detail below). Write address scrambler 335 scrambles the received counter value, using a predetermined fixed address scrambling function, thereby providing the write address value W_ADDR to the memory under test. The address scrambling function implemented by read address scrambler 235 and write address scrambler 335 is selected in view of the address line twisting implemented by the memory under test, thereby ensuring that the memory under test receives the proper address values at the memory interface.

Returning now to FIG. 3C, the configuration register $CR_{10}$ stores a 64-bit configuration values CFG_10[63:0], which configures data generation circuit 400 within transaction generation unit 106. The configuration value CFG_10[63:0] includes 45 reserved bits RESVD, a 3-bit data scrambler value SCRAMBLE, and a 16-bit data register value DATA_REG[15:0].

Figure 4:
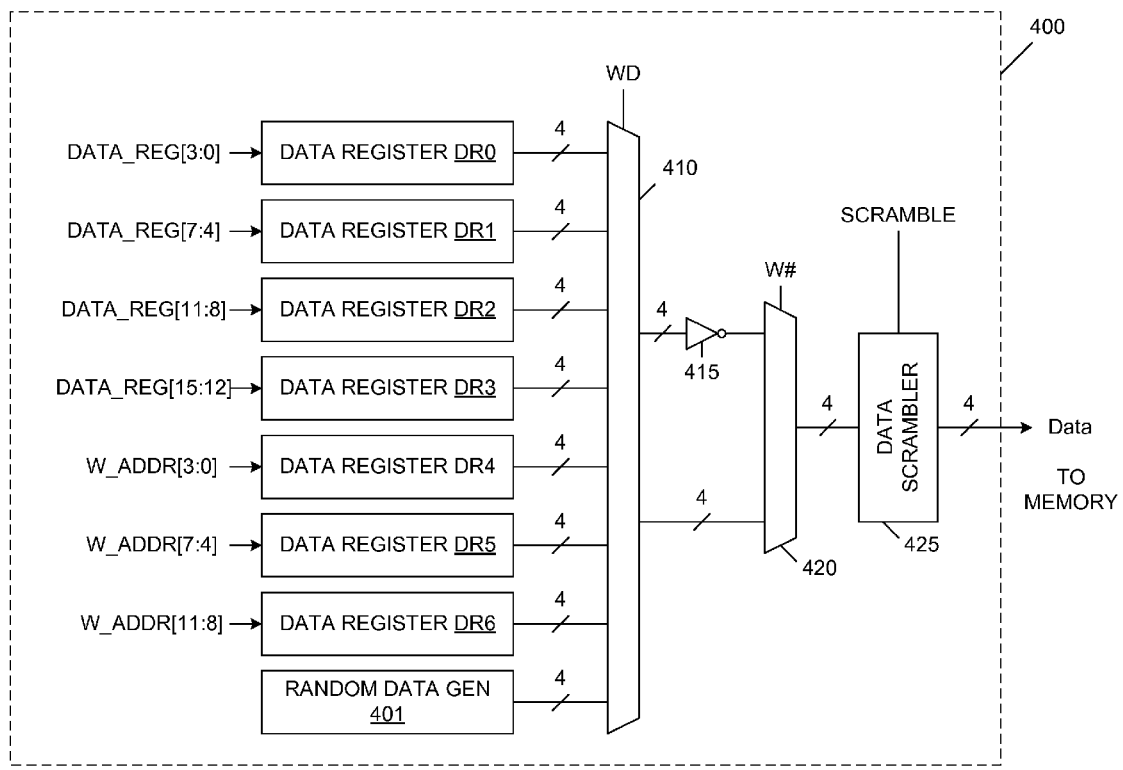
FIG. 4 is a block diagram illustrating data generation circuitry implemented by the PCDTE of FIG. 1, in accordance with one embodiment of the present invention.

FIG. 4 is a block diagram illustrating the data generation circuit 400 of transaction generation unit 106 in accordance with one embodiment of the present invention. Data generation circuit 400 includes data registers DR0-DR6, random data generator 401, write data multiplexers 410 and 420, inverter 415 and data scrambler 425. Data registers DR0, DR1, DR2 and DR3 are programmed to store the data register bits DATA_REG[3:0], DATA_REG[7:4], DATA_REG[11:8] and DATA_REG[15:12], respectively, from configuration register $CR_{10}$. Data registers DR4, DR5 and DR6 are programmed to store the write address bits W_ADDR[3:0], W_ADDR[7:4] and W_ADDR[11:8], respectively, from write address generation circuit 300. Thus, each of the data registers DR0-DR6 can be programmed with a corresponding 4-bit data value, which can be used to generate data values to be written to the memory under test (or be provided as read compare data values). Random data generator 401 provides a random O-bit data value as an output.

Write data multiplexer 410 receives the 4-bit data values from data registers DR0-DR6 and random data generator 401. Write data multiplexer 410 routes one of these 4-bit write data values in response to a write data selection signal WD (which is described in more detail below). Inverter 415 inverts the write data value routed by multiplexer 410, such that write data multiplexer 420 receives both the write data value routed by multiplexer 410, and the inverse of the write data value routed by multiplexer 410. Write data multiplexer 420 routes either the write data value routed by multiplexer 410, or the inverse of the write data value routed by multiplexer 410, to data scrambler 425, in response to a write select signal W# (which is described in more detail below). Data scrambler 425 scrambles the received data value, wherein the scrambling function is selected by the data scrambler value SCRAMBLER provided by configuration register $CR_{10}$. The data scrambling function is selected in view of the data line twisting implemented by the memory under test, thereby ensuring that the memory under test receives the proper data values at the memory interface.

Note that the data scrambling function is programmable using configuration register $CR_{10}$, thereby enabling PCDTE 100 to be used to test different types of memories that have different data line twisting characteristics.

The 4-bit data value provided by data scrambler 425 (Data) is replicated a predetermined number of times to create the data value DATA. For example, if the data value DATA has a width of 72-bits (i.e., the width of a read/write operation to the memory under test is 72-bits), then the 4-bit data value provided by data scrambler 425 is repeated 18 times (72/4=18) to create the data value DATA.

Figure 5:
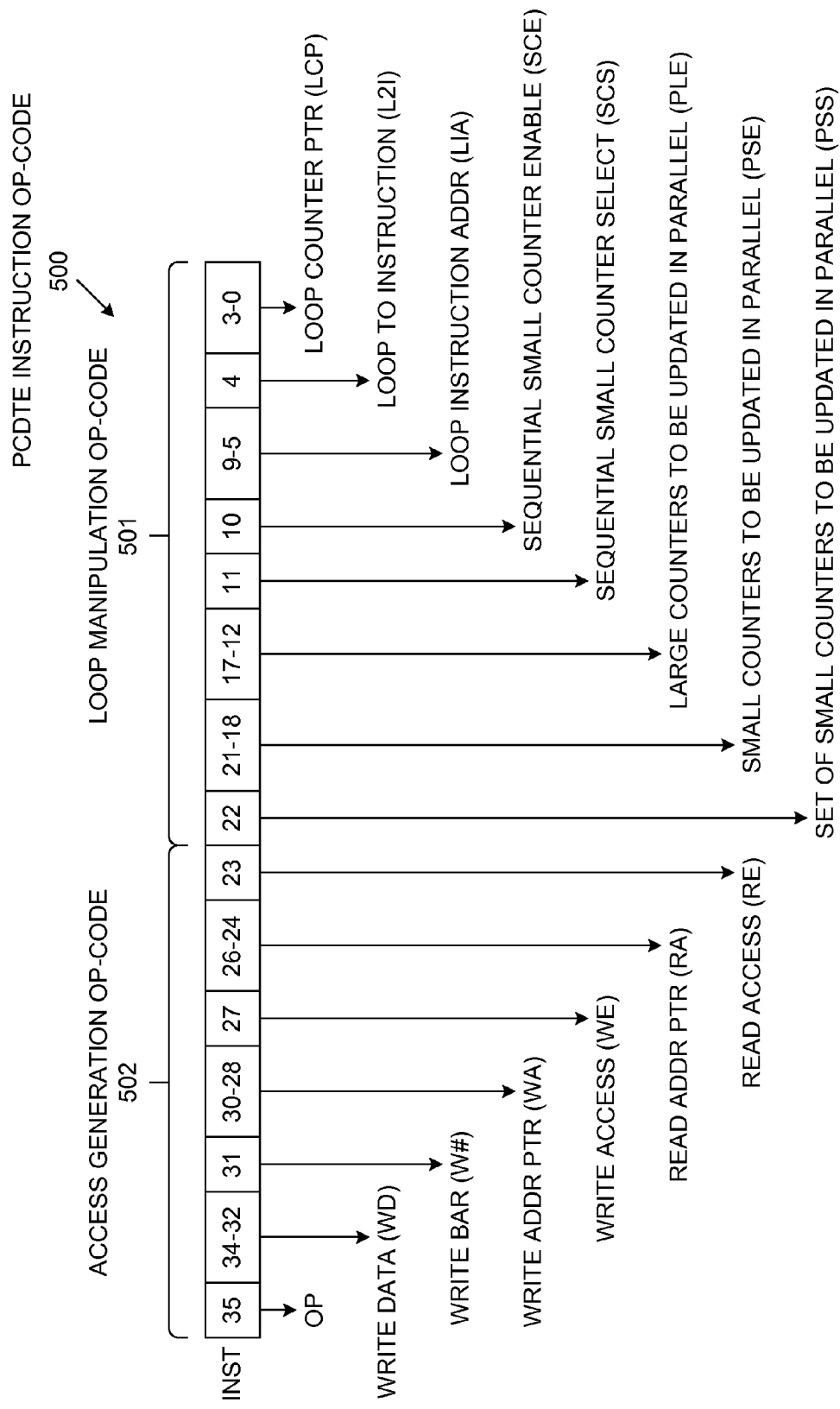
FIG. 5 is a block diagram illustrating and instruction op-code implemented by the PCDTE of FIG. 1, in accordance with one embodiment of the present invention.

FIG. 5 is a block diagram illustrating a PCDTE instruction op-code 500 INST[35:0] for PCDTE 100, in accordance with one embodiment of the present invention. A plurality of instruction op-codes, each having the same format as instruction op-code 500, are stored in programmable instruction memory 101. In the described examples, programmable instruction memory 101 has the capacity to store up to 32 instruction op-codes (i.e., M=32). However, programmable instruction memory 101 can have other capacities in other embodiments. In general, a larger programmable instruction memory 101 will allow more characterization-debug-test operations to be performed on chip 150.

Although instruction op-code 500 includes 36-bits in the illustrated example, it is understood that instruction op-codes having different widths can be implemented in other embodiments. The width of PCDTE instruction op-code 500 dictates the width of programmable instruction memory 101.

As described in more detail below, PCDTE instruction op-code 500 is used to initiate read/write operations or no operation (NOP) to a memory (or other circuitry) under characterization-debug-test. PCDTE instruction op-code 500 is able to access different address sources from different ones of the specialized counters 105. PCDTE instruction op-code 500 is also able to access different sources of data from the data registers DR0-DR6 (and the random data generator 401) within transaction generation unit 106. PCDTE instruction op-code 500 has the ability to loop to itself, as well as the ability to loop with any other PCDTE instruction op-code. PCDTE instruction op-code 500 is able to increment multiple counters 105 in parallel. PCDTE instruction op-code 500 is also able to increment multiple counters 105 sequentially.

PCDTE instruction op-code 500 is split into two op-codes, including a loop manipulation op-code 501 that controls program counter 104 and specialized counters 105, and an access generation op-code 502 that generates instruction dependent transactions. Access generation op-code 502 can also be used to change the key parameters of the chip 150, such as timing and voltage, using chip parameter controller 107.

Access generation op-code 502 includes a read access enable bit (RE=INST[23]), a read address pointer (RA=INST[26:24]), a write access enable bit (WE=INST[27]), a write address pointer (WA=INST[30-28]), a write data bar select signal (W#=INST[31]), a write data multiplexer select value (WD=INST[34:32]), and an operating parameter selection bit (OP=INST[35]). A read access enable bit RE having a logic '0' value indicates that no read operation should be performed (NOP), while a read access enable bit RE having a logic '1' value indicates a read operation will be performed. Controller 103 passes the read access enable bit RE through transaction generation logic 106 to the memory under test.

The read address pointer RA indicates which one of the specialized counters 105 will provide a read address for an indicated read operation. Controller 103 transmits the read address pointer RA to the read address multiplexer 230 in read address generation block 250 (FIG. 2A). In response, read address multiplexer 230 routes a selected one of the 20-bit counter values provided by large counters 200-205 and switches 215 and 225 to read address scrambler 235. Read address scrambler 235 scrambles the received counter value in the manner described above to provide a read address R_ADDR to the memory under test.

Returning now to access generation op-code 502, a write access enable bit WE having a logic '0' value indicates that no write operation should be performed (NOP), while a write access enable bit having a logic '1' value indicates that a write operation will be performed. Controller 103 passes the write access enable bit WE through transaction generation logic 106 to the memory under test.

The write address pointer WA indicates which one of the specialized counters 105 will provide a write address for an indicated write operation. Controller 103 transmits the write address pointer WA to the write address multiplexer 330 in write address generation block 350 (FIG. 2B). In response, write address multiplexer 330 routes a selected one of the 20-bit counter values provided by large counters 200-205 and switches 215 and 225 to write address scrambler 335. Write address scrambler 335 scrambles the received counter value in the manner described above to provide a write address W_ADDR to the memory under test.

Also within access generation op-code 502, the write data register select value WD indicates which one of a plurality of data registers within transaction generation unit 106 provides the write data for an indicated write operation. The write data bar select signal W# indicates whether the write data, or the inverse of the write data, is used to implement the write operation. Controller 103 transmits the write data register select value WD to the write data multiplexer 410 of data generator 400 (FIG. 4). As described above, multiplexer 410 routes a selected one of the 4-bit data values provided by data registers DR0-DR6 and random data generator 401 in response to the write data register select value WD. Controller 103 also transmits the write data bar select signal W# to write data multiplexer 420 of data generator 400 (FIG. 4). As described above, multiplexer 420 selectively routes either the data value routed by multiplexer 410, or the inverse of the data value routed by multiplexer 410, to data scrambler 425 in response to the write data bar select signal W#. Data scrambler 425 provides the data value DATA to the memory under test in the manner described above.

The operating parameter selection bit OP of the access generation op-code 502 can be used to select an operating parameter of chip 150 (e.g., supply voltage or signal timing) during implementation of the corresponding instruction. For example, an operating parameter selection bit OP having a logic '0' value indicates that a first supply voltage should be implemented on chip 150, while an operating parameter selection bit OP having a logic '1' value indicates that a second supply voltage, different than the first supply voltage, should be implemented on chip 150. Upon receiving an instruction, controller 103 instructs chip parameter controller 107 to set the supply voltage specified by the operating parameter selection bit OP. Note that in other embodiments, additional operating parameter selection bits can be used to select more than two supply voltage levels. Moreover, additional operating parameter selection bits can be used to control other chip parameters, such as signal delay.

Loop manipulation op-code 501 includes a loop counter pointer (LCP=INST[3:0]), a loop to instruction indicator (L2I=INST[4]), a looped instruction address (LIA=INST[9:5]), a sequential small counter enable signal (SCE=INST[10]), a sequential small counter select signal (SCS=INST[11]), parallel large counter enable bits (PLE=INST[17:12]), parallel small counter enable bits (PSE=INST[21:18]), and parallel small counter set select (PSS=INST[22]).

The loop counter pointer LCP indicates which counter of the specialized counters 105 is used as a loop counter for the corresponding instruction. The loop counter pointer LCP is a 4-bit value, which allows any one of the large counters 200-205, any one of the counter sets 206-207, or any one of the small counters 210-213 or 220-223 to be selected as the loop counter of the instruction.

A loop-to-instruction indicator bit L2I having a logic '0' value indicates that the present instruction does not loop with any other instruction, while a loop to instruction indicator bit L2I having a logic '1' value indicates that the present instruction loops with another instruction op-code in programmable instruction memory 101. The looped instruction address LIA points to an address of programmable instruction memory 101 that stores an instruction that is looped with the present instruction. Allowing instructions to loop with one another advantageously increases the range of operations that can be implemented by PCDTE 100.

As described above, the specialized counters 105 include six large counters 200-205 and two small counter sets 206-207, wherein each of the small counter sets 206-207 includes four small counters (i.e., 210-213 and 220-223). A sequential small counter enable signal SCE having a logic '0' value indicates that sequential counting is not enabled within either of the two sets of small counters 206-207 (i.e., each of the small counters 210-213 and 220-223 is operated as a normal counter). Conversely, a sequential small counter enable signal SCE having a logic '1' value indicates that sequential counting is enabled within one of the two sets of small counters 206-207 (i.e., one of the small counter sets 206-207 is operated as an integrated counter). The sequential small counter select signal SCS indicates which one of the two sets of small counters 206 or 207 is configured to implement sequential counting. For example, a sequential small counter signal SCS having a value of '0' indicates that small counter set 206 is operated as an integrated counter, while a sequential small counter signal SCS having a value of '1' indicates that small counter set 207 is operated as an integrated counter.

Each of the six parallel large counter enable bits PLE is associated with a corresponding one of the six large counters 200-205 within specialized counters 105. The parallel large counter enable bits PLE identify which of the six large counters 200-205 are updated (incremented/decremented) in parallel. A parallel large counter enable bit PLE having a logic '0' value indicates that the corresponding large counter is not updated in parallel with the other large counters, while a parallel large counter enable bit PLE having a logic '1' value indicates that the corresponding large counter is updated in parallel with other large counters also having a logic '1' parallel large counter enable bit PLE.

A parallel small counter set select signal PSS having a logic '0' value indicates that one of the two sets of small counters (e.g., small counter set 206) is enabled to implement parallel updating, while a parallel small counter set select signal PSS having a logic '1' value indicates that the other one of the two sets of small counters (e.g., small counter set 207) is enabled to implement parallel updating. As described above, each set of small counters includes four small counters. Each of the four parallel small counter enable bits PSE is associated with a corresponding one of the four small counters in a set. A parallel small counter enable bit PSE having a logic '0' value indicates that the corresponding small counter is not updated in parallel with the other small counters of the set, while a parallel small counter enable bit PSE having a logic '1' value indicates that the corresponding small counter is updated in parallel with other small counters of the set that also have a logic '1' parallel small counter enable bit PSE. In an alternate embodiment, where instruction size (gate count) is not an issue, two sets of PSE bits can be used, wherein each set of small counter sets 206 and 207 has a corresponding set of four PSE bits. In this alternate embodiment, the PSS signal is not required.

In accordance with one embodiment, controller 103 sequentially fetches and executes the instruction op-codes stored in programmable instruction memory 101, thereby performing a sequence of read/write/NOP operations within the memory under test.

Execution of an exemplary instruction op-code will now be described. In this example, the instruction op-code specifies that read accesses should be performed using addresses provided by large counter 200 (RE=1 and RA='000'), and write accesses should be performed using addresses provided by large counter 201, and write data provided by data register DR1 (WE=1, WA='001', WD='001', and W#=0). In this example, large counter 202 serves as the loop counter, the instruction is not looped with another instruction, the small counter sets 206-207 are not used (LCP='0010', L2I=0, LIA='xxxxx', SCE=0, SCS=x, PSE=0000, PSS='x'). In this case, read and write operations are performed in parallel to the memory under test. The read address (large counter 200), the write address (large counter 201) and the loop counter (large counter 202) are updated (incremented-decremented) in parallel until the loop counter (large counter 202) expires (i.e., PLE='111000'). As a result, the instruction op-code may cause a large number of sequential read/write operations to performed to the memory under test. Upon detecting that the loop counter (large counter 202) has expired, controller 103 fetches the next instruction op-code within programmable instruction memory 101, and executes this instruction op-code.

If an instruction op-code selects one of the small counter sets 206-207 to operate as an integrated counter (SCE=1), controller 103 links the small counters of the small counter set. Linking the small counters is like setting a priority of incrementing the counters. For example, if small counter set 206 is selected to operate as an integrated (sequential) counter, controller 103 may increment small counter 210 until this counter expires, then increment small counter 211 until this counter expires, then increment small counter 212 until this counter expires, and then increment small counter 213 until this counter expires. As described above, these small counters 210-213 can be configured as column, row, sector and bank address counters.

As described above, transaction generation unit 106 generates accesses for the memory under test by multiplexing counter values to provide read/write addresses and write data (or read compare data). This flexibility allows the number of ports implemented by PCDTE 100 to be increased with a minimal increase in the gate count of PCDTE 100. That is, additional ports can be added by adding additional multiplexing structures to PCDTE 100. For example, to add an additional read port to PCDTE 100, an additional read multiplexer (similar to multiplexer 230) and an additional read address scrambler (similar to read address scrambler 235) would be coupled to counters 200-207, and additional bits would be added to access generation op-code 502 to specify a read access enable bit (RE) for this additional read port, and an additional read address pointer (RA) for this additional read port. Additional write ports can be added to PCDTE 100 in a similar manner.

Figure 6:
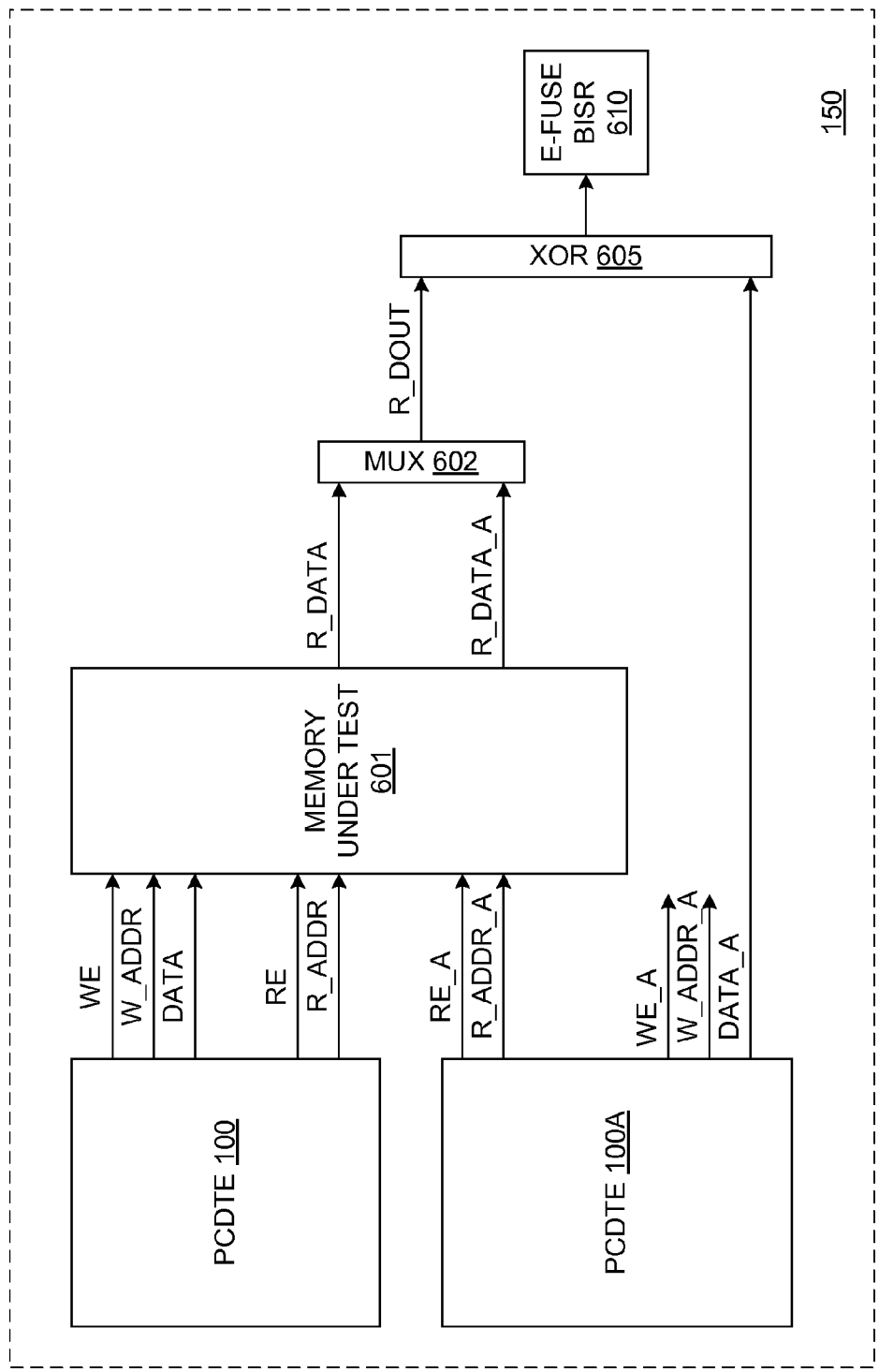
FIG. 6 is a block diagram illustrating a system that uses the PCDTE of FIG. 1 to implement programmable built-in self test (PBIST) and built-in self repair (BISR), in accordance with one embodiment of the present invention.

FIG. 6 is a block diagram illustrating a system 600, which uses PCDTE 100 to implement built-in self test (BIST) and built-in self repair (BISR), in accordance with one embodiment of the present invention. System 600 includes PCDTE 100, which has been described above, and PCDTE 100A, which is identical to PCDTE 100. PCDTE 100 and PCDTE 100A are coupled to a memory under test 601. Memory under test 601 includes one write port and two read ports. The write port and the first read port of memory 601 are coupled to PCDTE 100, and the second read port of memory 601 is coupled to PCDTE 100A. Memory 601 provides read data values R_DATA and R_DATA_A in response to read operations initiated on the first and second read ports of memory 601, respectively. Multiplexer 602 routes a selected one of the read data values R_DATA or R_DATA_A as the output data R_DOUT. The output data R_DOUT is provided to exclusive OR circuit 605. Read compare data DATA_A is provided from the write port of PCDTE 100A to exclusive OR circuit 605. PCDTE 100A algorithmically determines the read compare data DATA_A in response to the test pattern (i.e., the write and read operations) specified by PCDTE 100. Thus, assuming no errors exist in writing data to, and reading data from memory 601, then the output data R_DOUT should match the read compare data DATA_A. Exclusive OR circuit 605 indicates any differences that exist between the output data R_DOUT and the read compare data DATA_A (i.e., errors within memory 601). Exclusive OR circuit 605 transmits this information to E-Fuse/BISR circuit 610, which performs corrective actions in response to the detected differences/errors.

Figure 7:
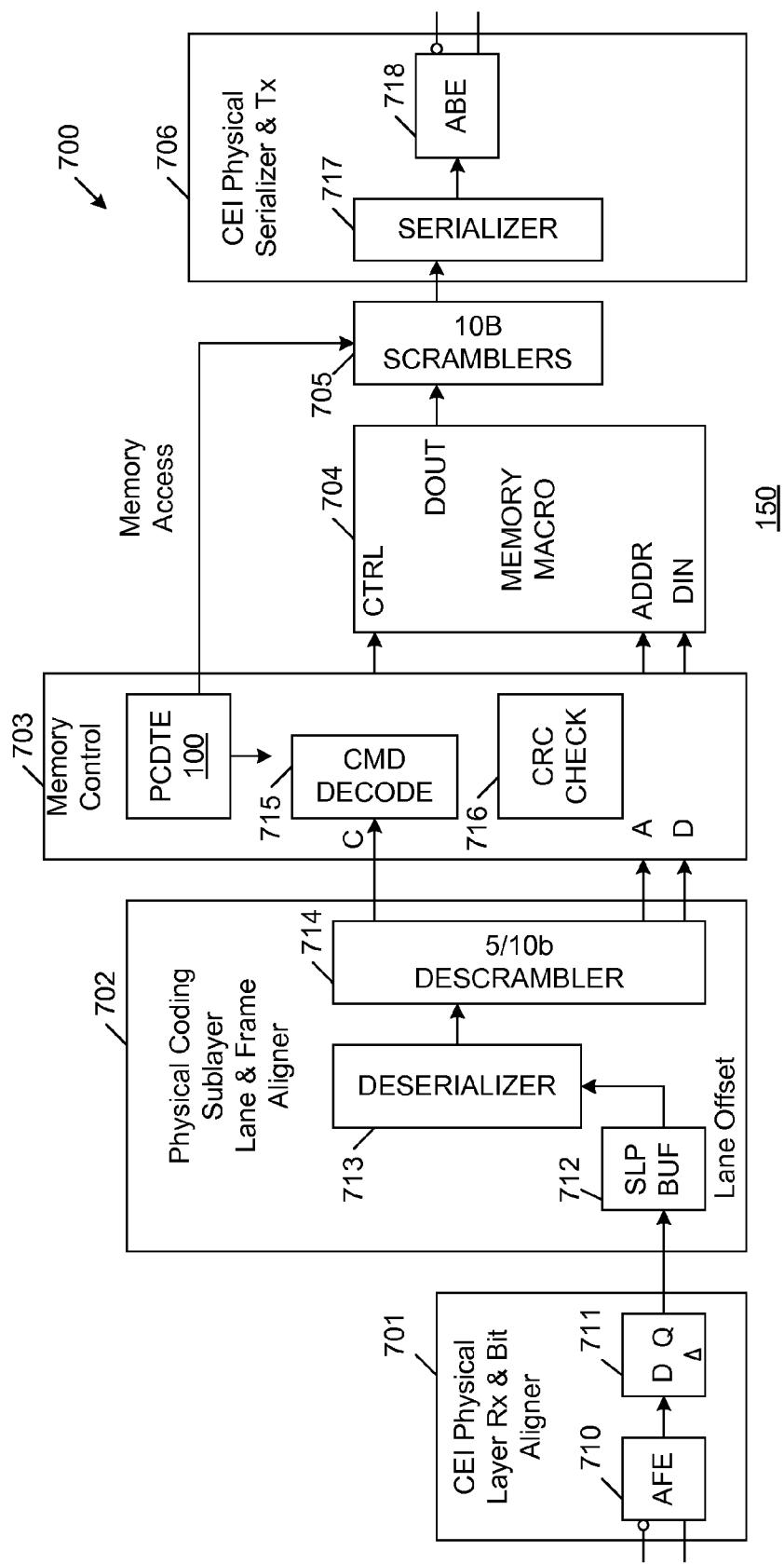
FIG. 7 is a block diagram of a bandwidth engine that may be implemented using the PCDTE of FIG. 1 in accordance with one embodiment of the present invention.

FIG. 7 is a block diagram of a bandwidth engine 700 that may be implemented within chip 150 in accordance with another embodiment of the present invention. Bandwidth engine 700 illustrates one option for locating PCDTE 100 within chip 150. Bandwidth engine 700 includes CEI physical layer receiver and bit aligner 701, physical coding sublayer (PCS) lane and frame aligner 702, memory control logic 703, memory macro 704, data scrambler 705, and CEI physical serializer and transmitter 706. In the bandwidth engine 700 of FIG. 7, CEI refers to a serial communication interface protocol such as the one disclosed in U.S. patent application Ser. No. 12/697,763, which is assigned to MoSys, Inc.

CEI physical layer receiver and bit aligner 701 includes an analog front end (AFE) 710 that receives a high speed stream of serial data from a source external to the chip 150, and a flip-flop 711 that aligns this data with a clock signal. PCS lane and frame aligner 702 includes a slip buffer 712 that stores the aligned serial data and implements a lane offset function, a de-serializer 713 that de-serializes the data provided by the slip buffer 712, and a de-scrambler 714 that de-scrambles the data provided by de-serializer 713. Memory control logic 703 includes a command decoder 715 that decodes memory access commands from the data received from descrambler 714, and CRC check logic 716 that identifies and corrects errors in the data received from descrambler 714. Memory control logic also includes PCDTE 100. Memory macro 704 receives control, address and data signals from memory control logic 703. Note that the control, address and data signals received by memory macro 704 may be provided in response to serial data received by AFE 710 (and transmitted through blocks 711-716). Alternately, the control, address and data signals provided to memory macro 704 may be provided by PCDTE 100 in the manner described above.

Data read from memory macro 704 is provided to data scramblers 705. In response, data scramblers 705 provide scrambled data to data serializer 717. In response, data serializer 717 provides serial data to analog back end 718, which transmits high-speed serial data off of the chip 150.

In accordance with one embodiment, the memory access signals generated at the read port and/or write port of PCDTE 100 are routed directly to data scramblers 705 (rather than directly to memory macro 704). As a result, the memory access signals generated by PCDTE 100 are scrambled (by data scramblers 705), serialized (by data serializer 717), and are transmitted off of chip 150 as high-speed serial data by analog back end 718. In accordance with one embodiment of the present invention, these memory access signals are transmitted to another chip having a bandwidth engine similar to the bandwidth engine 700 of chip 150. This configuration advantageously exercises the transmit path of bandwidth engine 700, and the receive path of the external bandwidth engine. Memory access signals transmitted from bandwidth engine 700 could be used to test a memory macro in the other chip.

In an alternate embodiment, the analog back end 718 is coupled to the analog front end 710, such that the memory access signals generated by PCDTE 100 and transmitted from analog back end 718 are received by analog front end 710. In this embodiment, the data path through SerDes transmitter 706, SerDes receiver 701, PCS lane and frame aligner 702 and memory control logic 703 to the memory macro 704 are exercised in a loop back mode.

Although the invention has been described in connection with several embodiments, it is understood that this invention is not limited to the embodiments disclosed, but is capable of various modifications, which would be apparent to a person skilled in the art. Accordingly, the present invention is limited only by the following claims.

I claim:

1. An integrated circuit chip comprising:
   an interface that receives signals external to the integrated circuit chip;
   a programmable test engine coupled to the interface that includes:
      a programmable instruction memory that stores one or more instructions received by the interface;
      a programmable configuration memory that stores a plurality of configuration values;
      a plurality of counters, each configured by a corresponding one of the configuration values; and
      a controller that accesses the one or more instructions from the programmable instruction memory, and in response, generates memory access transactions; and
   a transmitter that transmits the memory access transactions off of the integrated circuit chip, wherein the transmitter includes a serializer that serializes the memory access transactions into serial data.

2. The integrated circuit chip of claim 1, wherein the controller is coupled to receive the configuration values from the programmable configuration memory, wherein the controller updates the counters in response to the configuration values.

3. The integrated circuit chip of claim 1, further comprising a memory, wherein the controller retrieves memory access addresses from the counters in response to the one or more instructions, and wherein the memory access addresses retrieved from the counters are provided to access the memory.

4. The integrated circuit chip of claim 1, wherein the programmable configuration memory is coupled to the interface, wherein the configuration values are received by the interface.

5. The integrated circuit chip of claim 1, wherein the plurality of counters includes:
   a first set of counters; and
   a first switch that routes contents of the first set of counters as a memory access address.

6. The integrated circuit chip of claim 5, wherein the controller configures the switch in response to the configuration values stored in the programmable configuration memory.

7. The integrated circuit chip of claim 1, further comprising a first plurality of data registers, each storing a configuration value provided by the programmable configuration memory as a memory access data value.

8. The integrated circuit chip of claim 7, further comprising a second plurality of data registers, each storing a portion of a memory access address retrieved from the counters as a memory access data value.

9. The integrated circuit chip of claim 1, wherein selected ones of the configuration values specify the sequence in which a memory access address is composed from a set of the counters.

10. The integrated circuit chip of claim 1, wherein each of the instructions includes read parameters for specifying a read access and write parameters for specifying a write access.

11. The integrated circuit chip of claim 1, wherein each of the instructions includes parameters for specifying one of the counters as a loop counter for the instruction.

12. An integrated circuit chip comprising:
an interface that receives signals external to the integrated circuit chip; and
a programmable test engine coupled to the interface that includes:
a programmable instruction memory that stores one or more instructions received by the interface;
a programmable configuration memory that stores a plurality of configuration values;
a plurality of counters, each configured by a corresponding one of the configuration values; and
a controller that accesses the one or more instructions from the programmable instruction memory, and in response, initiates memory access transactions;
a transmitter that transmits the memory access transactions off of the integrated circuit chip; and
a receiver coupled to receive the memory access transactions transmitted off of the integrated circuit chip by the transmitter.

13. An integrated circuit chip comprising:
an interface that receives signals external to the integrated circuit chip; and
a first programmable test engine coupled to the interface that includes:
a programmable instruction memory that stores one or more instructions received by the interface;
a programmable configuration memory that stores a plurality of configuration values;
a plurality of counters, each configured by a corresponding one of the configuration values, wherein selected ones of the configuration values specify whether or not a reset value of a counter is incremented when the counter expires; and
a controller that accesses the one or more instructions from the programmable instruction memory, and in response, generates a first set of memory access transactions.

14. A method of implementing a programmable test engine on an integrated circuit chip comprising:
storing one or more instructions received from a location external to the integrated circuit chip; and
executing the one or more instructions on the integrated circuit chip, wherein executing a first instruction of the one or more instructions comprises:
selecting a first counter from a plurality of counters in response to the first instruction;
routing contents of the first counter as a first memory access address; and
accessing a memory in response to the first memory access address; and
transmitting the first memory access address off of the integrated circuit chip.

15. The method of claim 14, wherein executing the first instruction further comprises:
selecting a second counter from the plurality of counters in response to the first instruction;
routing contents of the second counter as a second memory access address; and
accessing a memory in response to the second memory access address.

16. The method of claim 14, wherein executing the first instruction further comprises:
selecting a first data register from a plurality of data registers in response to the first instruction;
routing contents of the first data register as a first data value, and
writing the first data value to an address of the memory specified by the first memory access address.

17. The method of claim 14, further comprising:
storing a plurality of configuration parameters received from a location external to the integrated circuit chip; and
configuring the plurality of counters in response to the configuration parameters.

18. The method of claim 17, wherein the step of configuring the plurality of counters comprises:
setting a reset value of a first counter of the plurality of counters; and
incrementing the reset value of the first counter each time the first counter expires.

19. The method of claim 17, wherein the step of configuring the plurality of counters comprises:
routing contents of a first counter of the plurality of counters as a row address of the memory access address in response to the configuration parameters; and
routing contents of a second counter of the plurality of counters as a column address of the memory access address in response to the configuration parameters.

20. The method of claim 14, further comprising sequentially executing the first instruction, and then a second instruction of the one or more instructions, in response to the first instruction.

21. The method of claim 14, wherein executing the first instruction further comprises updating a first plurality of the plurality of counters in response to the first instruction.

22. The method of claim 14, wherein executing the first instruction further comprises:
selecting a second counter from the plurality of counters in response to the first instruction;
routing contents of the second counter as a second memory access address; and
accessing the memory in response to a combination of the first and second memory access addresses.

23. The method of claim 14, further comprising receiving the first memory access address transmitted off of the integrated circuit chip with a receiver on the integrated circuit chip.

24. The integrated circuit chip of claim 13, wherein:
the first programmable test engine further comprises:
a chip parameter controller configured to set operating conditions of the integrated circuit chip.

25. The integrated circuit chip of claim 24, wherein:
the controller is further configured to instruct the chip parameter controller to change the operating conditions of the integrated circuit chip in response to the one or more instructions.

26. The integrated circuit chip of claim 24, wherein:
the first programmable test engine further comprises a chip failure accumulation engine configured to store failures.

27. The integrated circuit chip of claim 24, further comprising:
a transmitter coupled to receive the first set of memory access transactions; and wherein:
the transmitter transmits the first set of memory access transactions off of the integrated circuit chip.

28. The integrated circuit chip of claim 13, wherein:

the first set of memory access transactions includes a first set of write access transactions, a first set of read access transactions, or one or more no operation transactions; and the integrated circuit chip further comprises:
- a memory configured to receive the first set of read access transactions from the controller and to generate a first set of read data values in response to the first set of read access transactions;
- a compare circuit configured to detect any differences between a first set of read compare data and the first set of read data values; and
- a built-in self-repair (BISR) module coupled to the compare circuit and configured to perform corrective actions in response to the differences detected by the compare circuit.

29. The integrated circuit chip of claim 28, wherein: the write access transactions contain the read compare data provided to the compare circuit.

30. The integrated circuit chip of claim 28, further comprising:

a transmitter coupled to receive the first set of memory access transactions; and wherein:

the transmitter transmits the first set of memory access transactions off of the integrated circuit chip.

31. The integrated circuit chip of claim 28, further comprising:
- a second programmable test engine coupled to the interface and configured to control loop manipulation op-code and access generation op-code, and in response, to generate a second set of write access transactions and a second set of read access transactions; and
- a multiplexer coupled to the compare circuit; wherein:
  - the memory is further configured to generate a second set of read data values in response to the second set of read transactions; and
  - the multiplexer is configured in response to one of the configuration values to select the first set of read data values or the second set of read data values.

32. The integrated circuit chip of claim 31, wherein:

the first programmable test engine is further configured to initiate the first set of write access transactions to the compare circuit; and the second programmable test engine is further configured to initiate the second set of write access transactions to the memory.

\* \* \* \* \*